United States Patent [19]

Nguyen et al.

[11] Patent Number: 5,920,484

[45] Date of Patent: Jul. 6, 1999

[54] METHOD FOR GENERATING A REDUCED ORDER MODEL OF AN ELECTRONIC CIRCUIT

[75] Inventors: Tuyen Van Nguyen; Jing Li, both of Austin, Tex.

[73] Assignee: Motorola Inc., Austin, Tex.

[21] Appl. No.: 08/753,835

[22] Filed: Dec. 2, 1996

[51] Int. Cl.⁶ .............................. G06F 17/50; G06F 17/16; G06F 17/17

[52] U.S. Cl. .......................... 364/489; 364/488; 364/490; 364/578

[58] Field of Search .................................... 364/488–491, 364/578

[56] References Cited

U.S. PATENT DOCUMENTS

| | | | |
|---|---|---|---|
| 5,313,398 | 5/1994 | Rohrer et al. | 364/468 |
| 5,379,231 | 1/1995 | Pillage et al. | 364/488 |
| 5,537,329 | 7/1996 | Feldmann et al. | 364/489 |
| 5,689,685 | 11/1997 | Feldmann et al. | 395/500 |

OTHER PUBLICATIONS

Zhaojun Bai et al,"ABLE:an Adaptive Block Lanczos Method for Non–Hermitian Eigenvalue Problems", Univ.of Kentucky, Dept. of Mathematics Res. Rpt. 95–04, May 10, 1995, pp. 1–33.

Cornelius Lanczos, "An Iteration Method for the Solution of the Eigenvalue Problem of Linear Differential and Integral Operators", Journal of Res. of Nat'l. Bureau of Standards, vol.45,No.4, Oct. 1950, Res.Paper 2133, pp. 255–282.

Tuyen V. Nguyen et al., "Dispersive Coupled Transmission Line Simulation using an Adaptive Block Lanczos Algorithm",Adv.Des. Tech. at Motorola,Austin, TX and Dept. of Mathematics,Univ. of Kentucky, 4 pgs., May 5, 1996.

K. Gallivan et al., "Asymptotic Waveform Evaluation via a Lanczos Method", Appl. Math. Lett.vol.7, No. 5, 1994, pp. 75–80.

Peter Feldmann et al., "Efficient Linear Circuit Analysis by Pade Approximation via the Lanczos Process", IEEE Transactions on Computer–Aided Des. of Integrated Circuits and Systems, vol.14, No.5, May 1995, pp. 639–649.

K.Gallivan et al., "Pade Approximation of Large–Scale Dynamic Systems With Lanczos Methods", Proceedings of the 33rd IEEE Conf.on Decision and Control,Dec.14,1994, vol.1 of 4, pp. 443–448.

Mustafa Celik et al,"Pole–Zero Computation in Microwave Cir.Using Pade Approximation", IEEE Transactions on Circuits and Systems–1:Fundamental Theory and Applications, vol.42,No.1, Jan.1995, pp. 6–13.

Nguyen et al. ("Dispersive Coupled Transmission Line Simulation using an Adaptive Block Lanczos Algorithm", Proceedings of the IEEE 1996 Custom Integrated Circuits Conference, May 5, 1996).

Gallivan et al. ("Pade Approximation of Large–Scale Dynamic Systems with Lanczos Methods", Proceedings of the 33rd IEEE Conference on Decision and Control, Dec. 14, 1994, vol. 1, pp. 443–448.

(List continued on next page.)

Primary Examiner—Kevin J. Teska
Assistant Examiner—Phallaka Kik
Attorney, Agent, or Firm—Daniel D. Hill

[57] ABSTRACT

A method for model reduction (48) for electronic circuit simulation (52) of an electronic circuit using multipoint matrix Padé approximation is provided herein. Using the method, state equations are generated from a linear circuit to be analyzed. One or more expansion frequencies and a number of moments for each of the one or more expansion frequencies are provided. Starting block Lanczos vectors using a first expansion frequency of the one or more expansion frequencies and the state equations are generated. New block Lanczos vectors are generated from the starting block Lanczos vectors. The new block Lanczos vectors are scaled and normalized. Breakdowns in the new block Lanczos vectors are detected and treated to generate new starting block Lanczos vectors.

20 Claims, 4 Drawing Sheets

OTHER PUBLICATIONS

Bucker et al. ("A Parallel Version of the Unsymmetric Lanczos Algorithm and its Application to QMR", Graduiertenkolleg "Informatik und Technik", RWTH Aachen, D–52056 Aachen, Germany, Mar. 1, 1996).

Gallivan et al. ("Asymptotic Waveform Evaluation via a Lanczos Method", Appl. Math. Lett., vol. 7, No. 5, 1994, pp. 75–80), Jan. 1994.

Cybenko ("An Explicit Formula for Lanczos Polynomials", Linear Algebra and Its Application, vol. 88–89, pp. 99–116, Jan. 1, 1987).

Su et al. ("Unsymmetric Lanczos Model Reduction and Linear State Function Observer for Flexible Structures", U.S. Government/NTIS, Sep. 1, 1991).

Bandyopadhyay et al. ("Time–Domain Pade Approximation and Modal–Pade Method for Multivariable Systems", IEEE Transactions on Circuits and Systems, vol. CAS–34, No. 1, Jan. 1987).

Nour–Omid et al. ("Lanczos and Arnoldi methods for the solution of convection–diffusion equations", Computer Methods in Applied Mechanics and Engineering, vol. 88, No. 1, pp. 75–95, Jun. 1, 1991).

Nour–Omid ("Solving Large linearlized Systems in Mechanics", Scopus Technology, Inc., Emeryville, CA, NTIS, Mar. 1992).

Simon ("The Lanczos Algorithm for Solving Symmetric Linear Systems", U.S. Government/NTIS, Apr. 20, 1982).

Kim ("Block Lanczos Algorithm", U.S. Government/NTIS, Dec. 1, 1989).

METHOD FOR GENERATING A REDUCED ORDER MODEL OF AN ELECTRONIC CIRCUIT

FIELD OF THE INVENTION

The present invention generally relates to electronic circuit modeling, and more specifically to a method for generating a reduced order model of an electronic circuit.

BACKGROUND OF THE INVENTION

The problem addressed here is the accurate and efficient computation of reduced order macromodels for large and complex linear circuit models to be used in circuit simulation and/or timing verification. Interconnect and parasitic effects are pervasive in all types of designs including digital, analog, and mixed signal designs. The computational costs due to the size and complexity of these circuit models is a major bottleneck in the verification of these designs. Therefore, a technique to provide accurate and compact macromodels of these linear circuits will have a significant impact on overall design cycle time.

In the early 80's as clock rates steadily increased to the point where interconnect effects could no longer be ignored in digital designs, the RC tree method was developed to provide quick delay estimation for timing verification. This technique has limited applicability because of its specific nature. The need was ripe for a general method of efficient delay estimation for linear interconnect circuits, and the Asymptotic Waveform Evaluation (AWE) technique was developed to address that need. The trends in electronic circuit and system designs have continued to accentuate that need as well as other needs.

Two recent trends in integrated circuit designs have brought out the importance of interconnect and parasitic effects in design verification: the evolution towards submicron designs and the rapid growth of telecommunication/RF circuit designs. The combination of high frequencies and high packaging densities in these designs has quickly increased the size as well as the complexity of the linear circuit models for circuit simulation and timing verification.

Therefore, there is a need for a general tool to provide accurate and compact reduced order macromodeling of these linear circuit models to significantly improve the throughput of circuit simulation as well as timing verification, which in turn will improve the total design cycle time. In order to facilitate the discussion of different innovations that have been developed and applied to the problem of model reduction for circuit simulation and timing verification, various issue and problems are listed below:

1. Generality: The method must be able to handle general linear multiport circuits or networks.
2. Flexibility: The method must be able to provide models of variable accuracy as required by a given problem.
3. Accuracy: The method must be able to provide accurate approximations or reduced order models over a wide range of frequency both in frequency and in the time domain if necessary.
4. Efficiency: The method needs to provide as compact a reduced model as possible for simulation/verification efficiency.

Three different prior art approaches are discussed below. The first include explicit moment matching techniques. The AWE technique was developed initially as a general technique to compute reduced order models of linear lumped circuits. This technique was later improved to handle distributed circuits. Two different implementations of the AWE technique have been patented (see U.S. Pat. No. 5,313,398 and U.S. Pat. No. 5,379,231). AWE was the first major application of explicit moment matching techniques for computing partial Padé approximations to the simulation of large interconnect circuits. One problem with this type of technique is the loss of numerical precision as the order of the approximation is increased. This problem limits the applicability of AWE in terms of approximations such as pole/zero analysis of analog circuits and transmission line modeling where high accuracy, i.e., high order approximation, is required. Complex Frequency Hopping (CFH) and multipoint Padé techniques have been developed to address the numerical precision problems of AWE. These techniques alleviate the numerical precision problem of AWE and allow higher order approximations to be computed. However, these problems are not completely solved by CFH and multipoint Padé techniques because both are still explicit moment matching methods. The loss of numerical precision for high order approximations is inherent in explicit moment matching techniques. In addition, these two techniques also incur significantly more computational cost than AWE, thus losing the key efficiency advantage of AWE.

The second approach includes the use of scaler Lanczos base algorithms. Scaler Lanczos techniques address the numerical precision problem described above. They are as efficient as AWE while allowing very high order approximations to be computed accurately. The remaining problems that affect the overall efficiency and accuracy of simulation and verification are enumerated below for the convenience of discussion:

(a) Unnecessary high order approximations (loss of compactness) due to the scalar nature of the underlying algorithm (one port at a time),
(b) Unnecessary high order approximations due to expansion about a single frequency, and
(c) stability of the reduced model.

Problem (a) is also inherent in the techniques described in AWE above. The scalar Lanczos based techniques have been extended to the block version to address this problem. These techniques are described in the Block Lanczos algorithms below. No block (multiport) version of the techniques described in AWE have been developed or reported. Problem (c) is related to problem (b) in the sense that too high an approximation around one expansion frequency may not ensure the stability of the reduced model. Rational Lanczos algorithms are developed to compute multipoint partial Padé approximations, i.e., approximations about multiple expansion frequency points. These techniques address problems (b) and (c), but do not address problem (a).

The third potential solution is the use of Block Lanczos algorithms. These techniques have been used to address problem (a) above by taking into account the interaction among ports to improve compactness of the reduced model. The scalar algorithm just processes one port at a time and does not take into account their interaction, thus not allowing common information to be shared by the approximation for each port. Problems (b) and (c) are not addressed by the Block Lanczos algorithms.

DETAILED DESCRIPTION OF a PREFERRED EMBODIMENT

Figure 1:
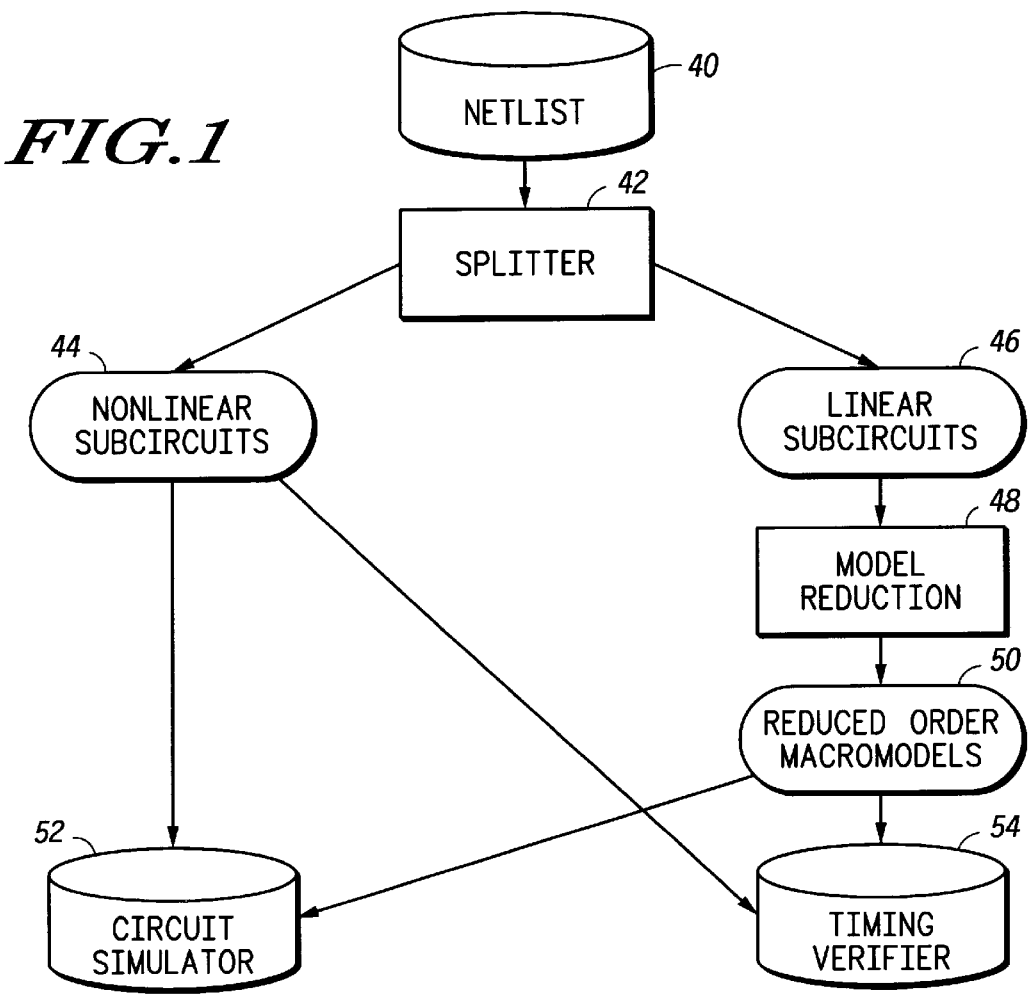
FIG. 1 is a block diagram illustrating a system in accordance with the present invention.

The method described in this patent application can be called "Rational Block Lanczos" to be consistent with the literature in numerical linear algebra. It is an algorithm used in model reduction of an electronic circuit. One feature of this method is that it computes multipoint matrix Padé approximations of a linear system. It can improve the efficiency of generating a reduced model by approximately 20%–300% compared to existing techniques based on the results obtained so far. The application of this technique in a circuit simulator such as Motorola's MC-SPICE circuit simulator has the potential for improving simulation efficiency by many orders of magnitude while maintaining excellent accuracy. This technique can also be applied to timing verification of electronic circuits and systems where path delays must be computed efficiently and accurately. FIG. 1 illustrates how the rational block Lanczos method can be used in circuit simulation or timing verification.

FIG. 1 is a block diagram illustrating a system in accordance with the present invention. A user supplied netlist 40 is split by splitter 42 into nonlinear subcircuits model 44 and linear subcircuits model 46. At a fairly basic level, nonlinear subcircuit elements in the netlist 40 are primarily transistors, while the linear subcircuit elements are the wires, or conductors, connecting the transistors. Traditionally, nonlinear elements have been of primary concern, but with sub-micron designs, linear subcircuit elements are becoming significantly more important. For designs implemented in a 0.35 micron process technology, it is estimated that over 50% of the delay in a circuit can be attributed to linear subcircuit elements.

The linear subcircuits model 46 is reduced by model reduction block 48 into a reduced order macromodel 50. The model reduction block 48 comprises a multipoint matrix Padé approximation as described below. The reduced order macromodel 50, combined with the nonlinear subcircuits model 44, can be used in a circuit simulator 52 and timing verifier 54.

Figure 2:
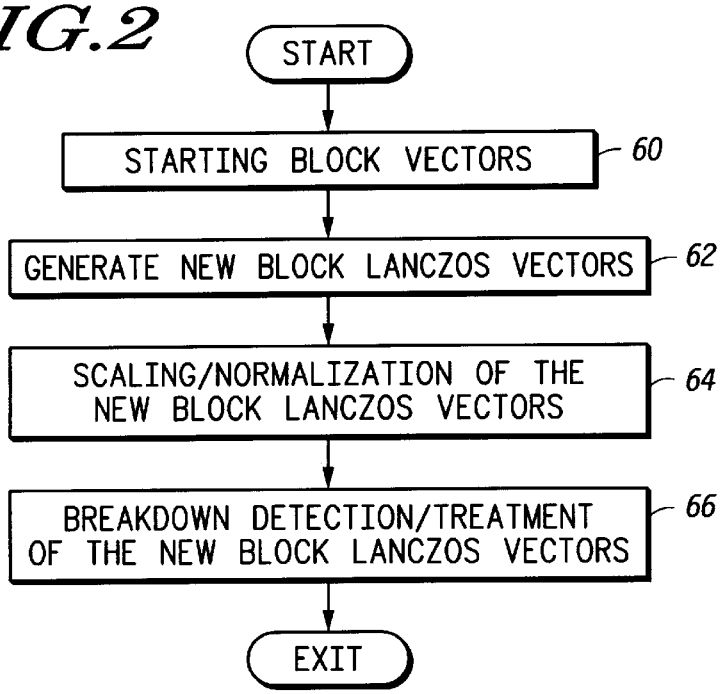
FIG. 2 is a flow diagram illustrating the model reduction method in accordance with the present invention.

FIG. 2 is a flow diagram illustrating a model reduction method implemented in model reduction block 48 (FIG. 1). The Block Lanczos model reduction method of model reduction block 48 is illustrated in four basic steps. At step 60, starting block vectors are generated. Then, at step 62, new Lanczos block vectors are generated from the starting block vectors. At step 64, scaling/normalization of the new Lanczos block vectors is accomplished. At step 66, breakdowns are detected in the new block Lanczos vectors, and if necessary, the breakdowns are treated.

Figure 3:
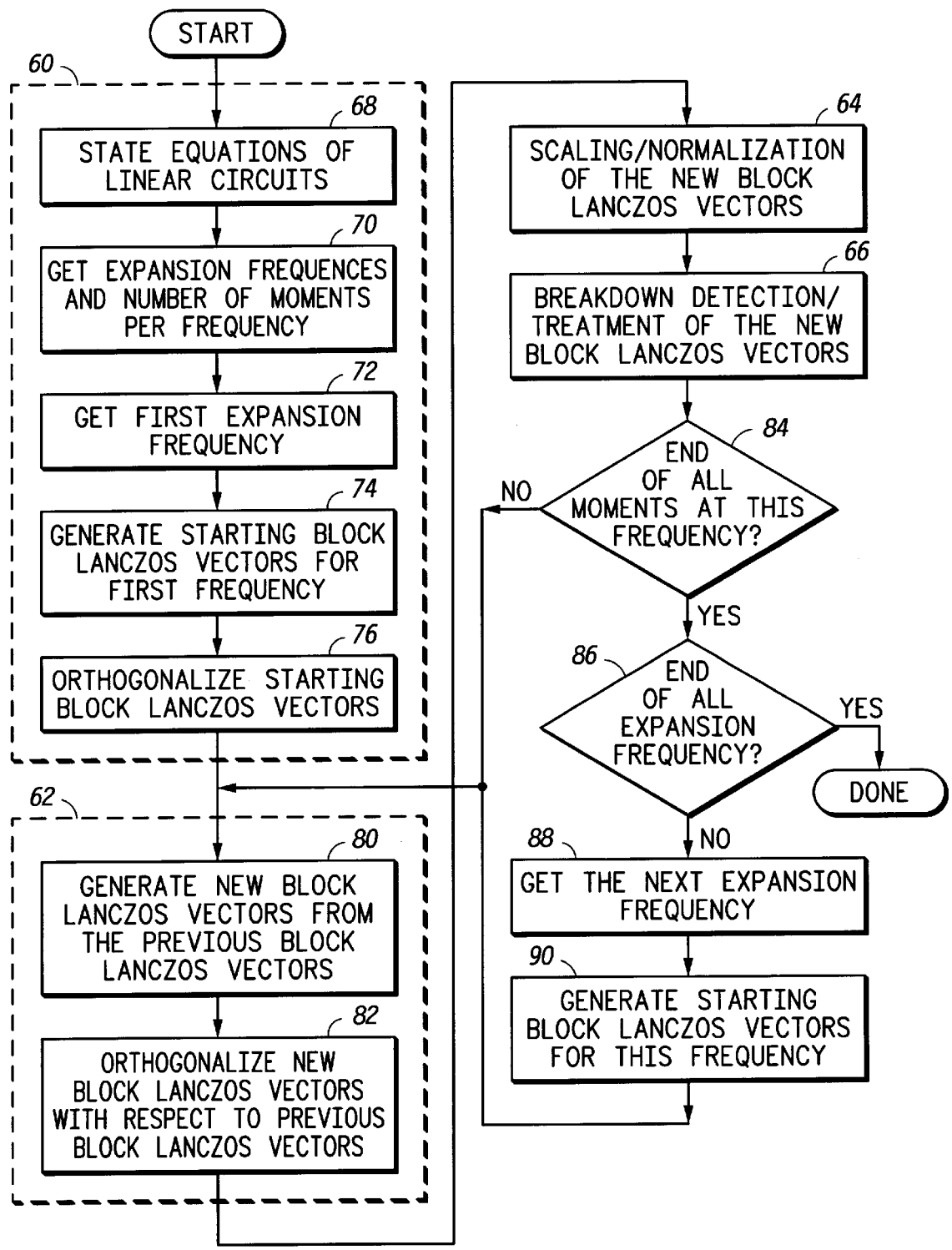
FIG. 3 is a flow diagram illustrating the block Lanczos reduction method of FIG. 2 in more detail.

FIG. 3 is a flow diagram illustrating the model reduction method of FIG. 2 in more detail. The method is for generating a multipoint Padé approximation of a linear circuit. The linear circuit is an interconnect between at least two circuit elements or circuit blocks of an electronic circuit. The linear circuit may also be an analog portion of the electronic circuit. In FIG. 3, step 60 is illustrated as steps 68, 70, 72, 74, and 76. At step 68, state equations of the linear circuits to be analyzed are generated. At step 70, expansion frequencies and number of moments per frequency are provided. At step 72, the first expansion frequency of one or more expansion frequencies are provided. At step 74, a set of starting block Lanczos vectors are generated using a first expansion frequency of the one or more expansion frequencies and the state equations provided at step 68. At step 76, the starting block Lanczos vectors are orthogonalized. Note that in the illustrated embodiment, the sets of block Lanczos vectors consist of pairs of block Lanczos vectors.

Step 62 of FIG. 2 is illustrated as steps 80 and 82 in FIG. 3. At step 80, new block Lanczos vectors are generated from the previous block Lanczos vectors. Then, at step 82, the new block Lanczos vectors are orthogonalized with respect to the previous block Lanczos vectors.

At step 64, scaling and normalizing of the new block Lanczos vectors is accomplished to produce a new set of scaled and normalized block Lanczos vectors. At step 66, breakdowns are detected in the new set of scaled and normalized block Lanczos vectors, and the detected breakdowns are treated.

At decision step 84, it is determined if all moments of the first expansion frequency have been used. If all of the moments have not been used, the NO path is taken to step 62, and a new sets of block Lanczos vectors is generated from the previous new block Lanczos vectors. If all of the moments have been used, then the YES path is taken to decision step 86 and it is determined if all of the expansion frequencies of the one or more expansion frequencies have been used. At decision step 86, if all of the expansion frequencies of the one or more expansion frequencies have not been used, then the NO path is taken to step 88 where the next expansion frequency is retrieved. At step 90, new starting block Lanczos vectors are generated and the flow continues at step 62. However, if at decision step 86, all of the expansion frequencies have been used, the flow is complete, and provides a reduced order model of the linear components of an electronic circuit. The accuracy of the model can be determined by comparing state equations generated from the reduced order model to the state equations of the circuit that were generated at step 68 of FIG. 3.

Figure 4:
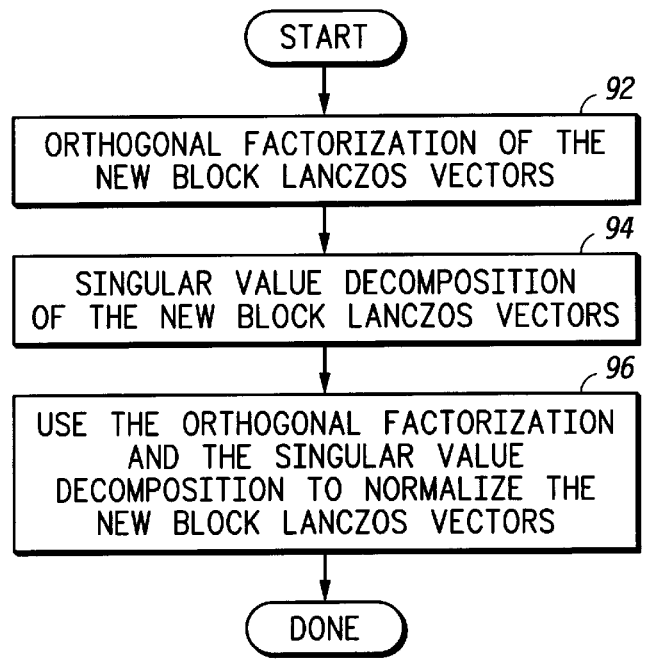
FIG. 4 is a flow diagram illustrating the scaling/normalization method of FIG. 3.

FIG. 4 is a flow diagram illustrating the scaling/normalization method of step 64 of FIG. 3. At step 92, a set of orthogonal factorizations corresponding to the set of new block Lanczos vectors are generated from the new block Lanczos vectors. At step 94, a singular value decomposition of the set of new block Lanczos vectors is generated. The singular value decomposition is used to detect breakdowns. At step 96, the set of new block Lanczos vectors are scaled and normalized using the generated set of orthogonal factorizations and the singular value decomposition. After step 96, the flow continues at step 66 of FIG. 3.

Figure 5:
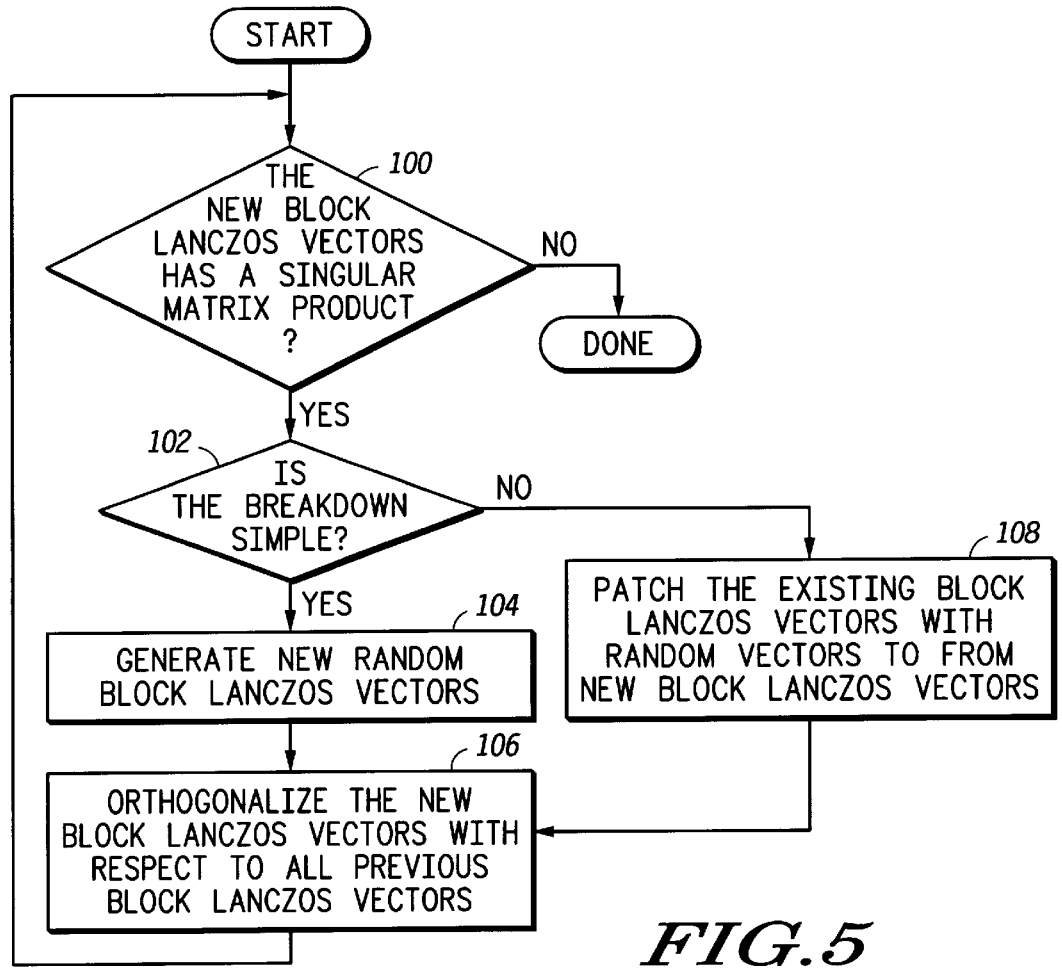
FIG. 5 is a flow diagram that illustrates the breakdown treatment illustrated in FIG. 3.

FIG. 5 is a flow diagram further illustrating the breakdown treatment illustrated in at step 66 of FIG. 3. At decision step 100, it is determined if a breakdown has occurred by checking whether the new set of scaled and normalized block Lanczos vectors has a singular matrix product. If yes, then the YES path is taken to decision step 102. If no, the NO path is taken and the flow continues to decision step 84 of FIG. 3. At decision step 102, it is determined if the breakdown is simple. That is, a breakdown is simple when the block Lanczos vector being considered is rank deficient. The breakdown is serious when the block Lanczos vector being considered is not rank deficient. If the breakdown is simple, the YES path is taken to step 104, and a first new set of random block Lanczos vectors are generated to become a new set of starting block Lanczos vectors. If it is determined that the breakdown is not simple, the NO path is taken to step 108 and the new set of scaled and normalized block Lanczos vectors are patched with a second new set of random block Lanczos vectors to form a new set of starting block Lanczos vectors. At step 106, the new set of starting block Lanczos vectors are orthogonalized with respect to all previously generated sets of block Lanczos vectors, and the flow is continued at step 100.

The basic steps of the Rational Block Lanczos algorithm are described below. Consider the general multiple input and output system:

$$Fx = Ax + Bu \quad y = Cx \tag{1}$$

where x is the state vector of size n, and u and y are the input and output vectors of size p..F and A are n×n square matrices. B and $C^T$ are matrices of size n×p. The matrix transfer function of the system in equation (1) can be written as:

$$H(s) = C(sF-A)^{-1}B = -C\,[I - \sigma(A - \sigma_i F)^{-1} F]^{-1} (A - \sigma_i F)^{-1} B \tag{2}$$

where $\sigma_i = s + s_i$, with $s_i$ being the expansion frequency. The $I^{th}$ moment of the transfer function can be defined as:

$$M_{il} = C[(A - \sigma_i F)^{-1} F]^l (A - \sigma_i F)^{-} B \tag{3}$$

In order to simplify the discussion of the basic algorithm, the same number of moments is assumed at each expansion frequency. Let $\tau$ be the total number of expansion frequencies, $\eta$ be the number of moments at each frequency, and $\upsilon$ be the total number of frequencies at all frequency. Then $\upsilon = \tau\eta$. Also, the frequency index is denoted by $1 \leq i \leq \tau$; the moment index at each frequency is denoted by $1 \leq j \leq \eta$; and the global moment index is denoted by k. The basic steps of the Rational Block Lanczos algorithm follow:

1. Get starting vectors: $S_0 = (A - \sigma_1 F)^{-1} B$ and $R_0 = C^T$

2. Dualize: $S_0 = Q_1 H_{10}$ and $R_0 = P_1 G_{10}$ such that $P_1^T Q_1 = I$.

3. For $i = 1 : \tau$

For $j = 1 : \eta$ a) $k = (i-1)\eta + j$ b) /* Generating next Lanczos Vector */

(1) if $(j < \eta)$ && $(i \leq \tau)$ then $S_k = (A - \sigma_i F)^{-1} F Q_k$ and $R_k = F^T (A - \sigma_i F)^{-T} P_k$ (2) else if $(j = \eta)$ && $(i < \tau)$ then $S_k = (A - \sigma_{i+1} F)^{-1} B H_{10}^{-1}$ and $R_k = F^T (A - \sigma_{i+1} F)^{-T} C^T G_{10}^{-1}$ (3) else /* $(j = \eta)$ && $(i = \tau)$ */

$S_k = (A - \sigma_1 F)^{-1} F Q_\eta$ and $R_k = F^T (A - \sigma_1 F)^{-T} P_\eta$ c) /* back orthogonalization w/ respect to previous Lanczos Vector */

(1) $H_k = P_k^T S_k$ and $G_k = Q_k^T R_k$ where $P_k = [P_1 \ldots P_k]$ and $Q_k = [Q_1 \ldots Q_k]$ (2) $S_k := S_k - Q_k H_k$ and $R_k := R_k - P_k G_k$ d) /* Scaling and Breakdown Analysis */

-continued (1) QR Factorizations: $S_k = Q_{k+1} H_{k+1,k}$ and $R_k = P_{k+1} G_{k+1,k}$ (2) Singular Value Decomposition: $P_{k+1}^T Q_{k+1} = U_k \Sigma_k V_k^H$ (3) $Q_{k+1} := Q_{k+1} V_k \Sigma_k^{-1/2}$ and $P_{k+1} := P_{k+1} \overline{U}_k \Sigma_k^{-1/2}$ (4) $H_{k+1,k} := \Sigma_k^{1/2} V_k^H H_{k+1,k}$ and $G_{k+1,k} := \Sigma_k^{1/2} U_k^T G_{k+1,k}$ end /* j */ end /* i */

In the above algorithm, step 3(b) generates the new Lanczos vector. Step 3(c) performs the back-orthogonalization with respect to previous Lanczos vectors. Step 3(d) performs scaling to ensure that $P_{k+1}^T Q_{k+1} = I$. The singular value decomposition is also used to detect breakdowns. Note that the basic algorithm described above assumes no breakdowns. The actual implementation has adopted the strategy for breakdown treatment described in the prior art. The algorithm will produce the following reduced systems in the right Krylov subspace, $K_R = \{Q_1, Q_2, \ldots, Q_v\}$, as $$F_R X_R = A_R X_R 30 \, B_R u \quad y = C_R X_R \tag{4}$$

where $F_R = H_{vv}, A_R = L_{vv} + \sigma_1 H_{vv}, B_R = P_v^T (A - \sigma_1 F)^{-1} B$ and $C_R = CQ_V L_{vv}$. $H_{vv}$ and $L_{vv}$ contain the coefficients for back-orthogonalization and normalization. Similarly, the reduced system in the left Krylov subspace, $K_L = \{P_1, P_2, \ldots, P_V\}$ can be written as:

$$F_L X_L = A_L X_L + B_L U \quad Y = C_L X_L \tag{5}$$

where $F_L = G_{vv}^T$, $A_L = K_{vv}^T + \sigma_1 G_{vv}$, $B_L = K_{vv}^T P_V^T (A - \sigma_1 F)^{-1} B$, and $C_L = CQ_V$. Again, $G_{vv}$ and $K_{vv}$ contain the coefficients for back-orthogonalization and normalization. The moments of these reduced systems are the same, and thus only one system needs to be considered.

Figure 6:
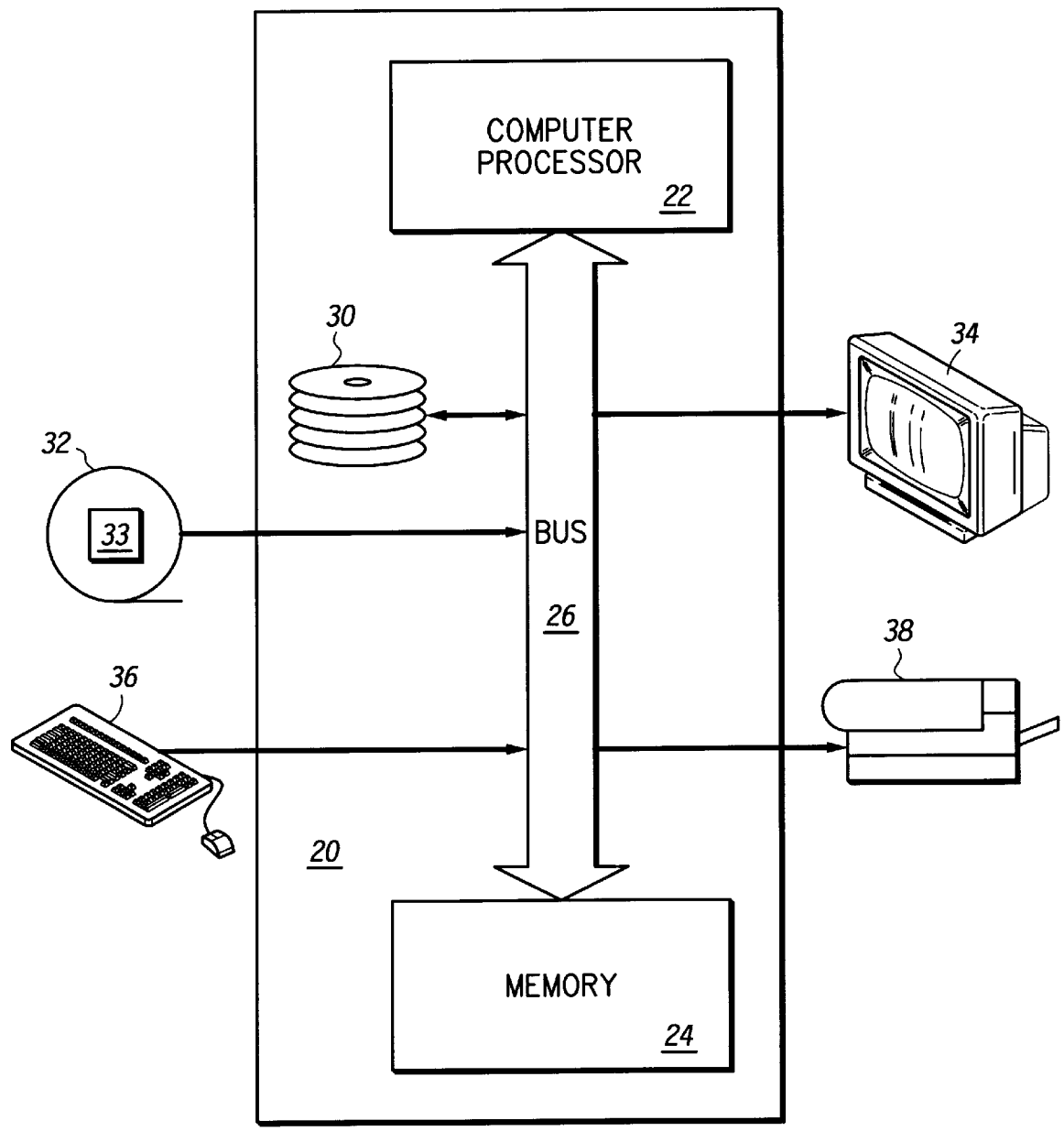
FIG. 6 is a block diagram showing a general purpose computer in accordance with the present invention.

FIG. 6 is a block diagram showing a general purpose computer 20. The general purpose computer 20 has a computer processor 22, and memory 24, connected by a bus 26. Memory 24 includes relatively high speed machine readable media such as DRAM (dynamic random access memory), SRAM (static random access memory), ROM (read only memory), EEPROM (electrically erasable programmable read only memory), flash EEPROM, and bubble memory. Also connected to the bus are secondary storage 30, external storage 32, output devices such as a monitor 34, input devices such as a keyboard (with mouse) 36, and printers 38. Secondary storage 30 includes machine readable media such as hard disk drives, magnetic drum, and bubble memory. External storage 32 includes machine :readable media such as floppy disks, removable hard drives, magnetic tape, CD-ROM, and even other computers, possibly connected via a communications line. The distinction drawn here between secondary storage 30 and external storage 32 is primarily for convenience in describing the invention. As such, it should be appreciated that there is substantial functional overlap between these elements. Executable versions of computer software 33, such as model reduction software 48 can be read from the external storage 32 and loaded for execution directly into the memory 24, or stored on the secondary storage 30 prior to loading into memory 24 for execution.

As can be seen, the described method generates rational block Lanczos vectors for model reduction of linear electronic circuitry. The method includes an adaptive scheme for breakdown treatment that addresses two problems of the single Padé approximation: poor approximation of the transfer function in the frequency domain far away from the expansion point and the instability of the reduced model when the original system is stable. Also, the described method alleviates the breakdown problems due to smaller Krylov subspace corresponding to each frequency point. The cost of full backward orthogonalization with respect to all previous Lanczos vectors is offset by more accurate and smaller order approximations.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for generating a reduced order model of an electronic circuit, comprising the steps of:

generating state equations from an electronic circuit to be analyzed;

providing one or more expansion frequencies and a number of moments for each of the one or more expansion frequencies;

generating a set of starting block Lanczos vectors using a first expansion frequency of the one or more expansion frequencies and the state equations;

orthogonalizing the set of starting block Lanczos vectors;

generating a new set of block Lanczos vectors from a previous set of block Lanczos vectors;

orthogonalizing the new set of block Lanczos vectors with respect to the previous set of block Lanczos vectors;

scaling and normalizing the new set of block Lanczos vectors to produce a new set of scaled and normalized block Lanczos vectors;

detecting breakdowns in the new set of scaled and normalized block Lanczos vectors, and if detected, treating the breakdowns to generate a new set of starting block Lanczos vectors from the new set of scaled and normalized block Lanczos vectors; and determining if all moments of the first expansion frequency have been used, and if all moments have not been used, generating new sets of block Lanczos vectors from the new set of starting block Lanczos vectors, and if all moments have been used, then determining if all expansion frequencies of the one or more expansion frequencies have been used, and if all of the expansion frequencies of the one or more expansion frequencies have not been used, retrieving a next expansion frequency of the one or more expansion frequencies and generating a new starting block Lanczos vectors, and if all of the expansion frequencies have been used, providing the reduced order model of the electronic circuit.

2. The method of claim 1, further comprising the step of detecting if the reduced order model meets a predetermined accuracy by comparing state equations generated from the reduced order model to the state equations of the electronic circuit.

3. The method of claim 1, wherein a set of block Lanczos vectors is characterized as being a pair of block Lanczos vectors.

4. The method of claim 1, wherein the step of scaling and normalizing further comprises the steps of:

generating a set of orthogonal factorizations corresponding to the new set of block Lanczos vectors;

generating a singular value decomposition of the new set of block Lanczos vectors; and scaling and normalizing the new set of block Lanczos vectors using the set of orthogonal factorizations and the singular value decomposition.

5. The method of claim 1, wherein the step of detecting breakdowns further comprises the steps of:

determining that a breakdown has occurred by checking whether the new set of scaled and normalized block Lanczos vectors has a singular matrix product;

determining that the breakdown is simple and generating a first new set of random block Lanczos vectors to become a new set of starting block Lanczos vectors;

determining that the breakdown is not simple and patching the new set of scaled and normalized block Lanczos vectors with a second new set of random block Lanczos vectors to form a new set of starting block Lanczos vectors; and orthogonalizing the new set of starting block Lanczos vectors with respect to all previously generated sets of block Lanczos vectors.

6. The method of claim 1, wherein the electronic circuit is characterized as being a linear circuit.

7. A method for model reduction for electronic circuit simulation of an electronic circuit:

generating state equations from a circuit to be analyzed;

providing one or more expansion frequencies and a number of moments for each of the one or more expansion frequencies;

generating a set of starting block Lanczos vectors using a first expansion frequency of the one or more expansion frequencies and the state equations;

generating a set of new block Lanczos vectors from the set of starting block Lanczos vectors;

scaling and normalizing the set of new block Lanczos vectors to produce a new set of scaled and normalized block Lanczos vectors; and detecting breakdowns in the set of new block Lanczos vectors, and if detected, treating the breakdowns to generate a set of new starting block Lanczos vectors from the new set of scaled and normalized block Lanczos vectors.

8. The method of claim 7, wherein the step of scaling and normalizing further comprises the steps of:

generating a set of orthogonal factorizations corresponding to the set of new block Lanczos vectors;

generating a singular value decomposition of the set of new block Lanczos vectors; and scaling and normalizing the set of new block Lanczos vectors using the set of orthogonal factorizations and the singular value decomposition.

9. The method of claim 8, wherein the step of detecting breakdowns further comprises the steps of:

determining that a breakdown has occurred by checking whether the new set of scaled and normalized block Lanczos vectors has a singular matrix product;

determining that the breakdown is simple and generating a first new set of random block Lanczos vectors to become a new set of starting block Lanczos vectors;

determining that the breakdown is not simple and patching the new set of scaled and normalized block Lanczos vectors with a second new set of random block Lanczos vectors to form a new set of starting block Lanczos vectors; and orthogonalizing the new set of starting block Lanczos vectors with respect to all previously generated sets of block Lanczos vectors.

10. The method of claim 9, wherein the electronic circuit is characterized as being a linear circuit.

11. The method of claim 10, wherein a set of block Lanczos vectors is characterized as being a pair of block Lanczos vectors.

12. The method of claim 11, further comprising a step of detecting if the method for model reduction meets a predetermined accuracy by comparing state equations generated from a reduced order model to the state equations of the circuit.

13. A method for generating a multipoint matrix Padé approximation of an electronic circuit, comprising the steps of:

generating state equations from a circuit to be analyzed;

providing one or more expansion frequencies and a number of moments for each of the one or more expansion frequencies;

generating a set of starting block Lanczos vectors using a first expansion frequency of the one or more expansion frequencies and the state equations;

orthogonalizing the set of starting block Lanczos vectors;

generating a new set of block Lanczos vectors from a previous set of block Lanczos vectors;

orthogonalizing the new set of block Lanczos vectors with respect to the previous set of block Lanczos vectors;

generating a set of orthogonal factorizations corresponding to the new set of block Lanczos vectors;

generating a singular value decomposition of the new set of block Lanczos vectors;

scaling and normalizing the new set of block Lanczos vectors using the set of orthogonal factorizations and the singular value decomposition to produce a new set of scaled and normalized block Lanczos vectors;

detecting breakdowns in the new set of scaled and normalized block Lanczos vectors, and if detected, treating the breakdowns to generate a new set of starting block Lanczos vectors from the new set of scaled and normalized block Lanczos vectors; and determining if all moments of the first expansion frequency have been used, and if all moments have not been used, generating new sets of block Lanczos vectors from the new set of starting block Lanczos vectors, and if all moments have been used, then determining if all expansion frequencies of the one or more expansion frequencies have been used, and if all of the expansion frequencies of the one or more expansion frequencies have not been used, retrieving a next expansion frequency and generating a new starting block Lanczos vectors, and if all of the expansion frequencies have been used, providing the multipoint matrix Padé approximation the electronic circuit.

14. The method of claim 13, wherein the step of detecting breakdowns further comprises the steps of:

determining that a breakdown has occurred by checking whether the new set of scaled and normalized block Lanczos vectors has a singular matrix product;

determining that the breakdown is simple and generating a first new set of random block Lanczos vectors to become a new set of starting block Lanczos vectors;

determining that the breakdown is not simple and patching the new set of scaled and normalized block Lanczos vectors with a second new set of random block Lanczos vectors to form a new set of starting block Lanczos vectors; and orthogonalizing the new set of starting block Lanczos vectors with respect to all previously generated sets of block Lanczos vectors.

15. The method of claim 13, wherein the electronic circuit is characterized as being a linear circuit.

16. The method of claim 15, wherein the linear circuit is characterized as being an interconnect between at least two circuit elements or circuit blocks of the electronic circuit.

17. The method of claim 15, wherein the linear circuit is characterized as being a model of an analog portion of an electronic circuit.

18. The method of claim 13, wherein a set of block Lanczos vectors is characterized as being a pair of block Lanczos vectors.

19. The method of claim 13, further comprising the step of detecting if the multipoint matrix Padé approximation meets a predetermined accuracy by comparing state equations generated from the multipoint matrix Padé approximation to the state equations of the electronic circuit.

20. The method of claim 13, wherein the multipoint matrix Padé approximation is for use in circuit simulation or timing verification of the electronic circuit.

* * * * *